(12) United States Patent
Radomski et al.

(10) Patent No.: US 9,947,514 B2
(45) Date of Patent: Apr. 17, 2018

(54) PLASMA RF BIAS CANCELLATION SYSTEM

(71) Applicant: MKS Instruments, Inc., Andover, MA (US)

(72) Inventors: Aaron T. Radomski, Conesus, NY (US); Sang Won Lee, Daejeon (KR); Larry J. Fisk, II, Fairport, NY (US); Jonathan W. Smyka, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 0 days.

(21) Appl. No.: 15/236,661

(22) Filed: Aug. 15, 2016

(65) Prior Publication Data

US 2017/0062187 A1  Mar. 2, 2017

Related U.S. Application Data

(60) Provisional application No. 62/212,661, filed on Sep. 1, 2015.

(51) Int. Cl.
*H01J 37/32* (2006.01)

(52) U.S. Cl.
CPC ...... *H01J 37/32183* (2013.01); *H01J 37/321* (2013.01); *H01J 37/32091* (2013.01); *H01J 37/32155* (2013.01)

(58) Field of Classification Search
CPC .......... H01J 37/32009; H01J 37/32091; H01J 37/321; H01J 37/32155; H01J 37/32174; H01J 37/32183
See application file for complete search history.

(56) References Cited

U.S. PATENT DOCUMENTS

| | | | |
|---|---|---|---|
| 6,174,450 B1 * | 1/2001 | Patrick | H01J 37/32082 118/723 E |
| 6,875,366 B2 * | 4/2005 | Sumiya | C23C 16/4401 134/1.1 |
| 7,615,983 B2 | 11/2009 | Hamaishi et al. | |
| 7,727,413 B2 | 6/2010 | Paterson et al. | |
| 7,902,991 B2 | 3/2011 | Park et al. | |

(Continued)

OTHER PUBLICATIONS

International Search Report for App. No. PCT/US2016/049293 dated Nov. 22, 2016.

*Primary Examiner* — Jason M Crawford
(74) *Attorney, Agent, or Firm* — Harness, Dickey & Pierce, P.L.C.

(57) ABSTRACT

An RF supply system in which a bias RF generator operates at a first frequency to provide a bias RF output signal and a source RF generator operates at a second frequency to provide a source RF output signal. The RF output power signals are applied to a load, such as a plasma chamber. The source RF generator detects a triggering event. In response to the triggering event, the source RF generator initiates adding frequency offsets to the source RF output signal in order to respond to impedance fluctuations in the plasma chamber that occur with respect to the triggering event. The triggering event detected by the source RF generator can be received from the bias RF generator in the form of a control signal that varies in accordance with the bias RF output signal.

33 Claims, 6 Drawing Sheets

(56) References Cited

U.S. PATENT DOCUMENTS

| | | | |
|---|---|---|---|
| 7,967,944 B2* | 6/2011 | Shannon | H01J 37/32082 156/345.2 |
| 9,408,288 B2* | 8/2016 | Valcore, Jr. | H01J 37/32165 |
| 9,536,749 B2 | 1/2017 | Marakhtanov et al. | |
| 9,593,411 B2* | 3/2017 | Hoffman | C23C 14/35 |
| 2004/0007984 A1 | 1/2004 | Coumou et al. | |
| 2004/0194890 A1* | 10/2004 | Moroz | H01J 37/32082 156/345.48 |
| 2004/0226657 A1* | 11/2004 | Hoffman | H01J 37/32174 156/345.28 |
| 2006/0232471 A1* | 10/2006 | Coumou | H01J 37/32082 342/450 |
| 2009/0284156 A1* | 11/2009 | Banna | H01J 37/321 315/111.21 |
| 2010/0227420 A1* | 9/2010 | Banna | H01J 37/321 438/10 |
| 2012/0097524 A1* | 4/2012 | Pipitone | C23C 14/354 204/192.1 |
| 2014/0106572 A1 | 4/2014 | Xu et al. | |
| 2014/0251788 A1* | 9/2014 | Ge | C23C 14/3471 204/192.12 |
| 2016/0307736 A1 | 10/2016 | Howald et al. | |
| 2016/0308560 A1 | 10/2016 | Howald et al. | |
| 2017/0062187 A1 | 3/2017 | Radomski et al. | |
| 2017/0103872 A1 | 4/2017 | Howald et al. | |

\* cited by examiner

PLASMA RF BIAS CANCELLATION SYSTEM

CROSS-REFERENCE TO RELATED APPLICATIONS

This application claims the benefit of U.S. Provisional Application No. 62/212,661, filed on Sep. 1, 2015. The entire disclosure of the above application is incorporated herein by reference.

FIELD

The present disclosure relates to RF control systems and to a RF control system to reduce impedance fluctuations in a load.

BACKGROUND

This section provides background information related to the present disclosure which is not necessarily prior art.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Plasma etching is frequently used in semiconductor fabrication. In plasma etching, ions are accelerated by an electric field to etch exposed surfaces on a substrate. The electric field is generated based on RF power signals generated by a radio frequency (RF) generator of a RF power system. The RF power signals generated by the RF generator must be precisely controlled to effectively execute plasma etching.

A RF power system may include a RF generator or supply, a matching network, and a load (e.g., a plasma chamber). The RF generator generates RF power signals, which are received at the matching network. The matching network matches an input impedance of the matching network to a characteristic impedance of a transmission line between the RF generator and the matching network. This impedance matching aids in maximizing an amount of power forwarded to the matching network ("forward power") and minimizing an amount of power reflected back from the matching network to the RF generator ("reverse power"). Forward power may be maximized and reverse power may be minimized when the input impedance of the matching network matches the characteristic impedance of the transmission line.

In a typical RF power generator configuration, output power applied to the load is determined by using sensors that measure the forward and reflected power or the voltage and current of the RF signal applied to the load. Either set of these signals is analyzed to determine the parameters of the power applied to the load. The parameters can include, for example, voltage, current, frequency, and phase. The analysis typically determines a power value which is used to adjust the output of the RF power supply in order to vary the power applied to the load. In a RF power delivery system, where the load is a plasma chamber, the varying impedance of the load causes a corresponding varying power applied to the load, as applied power is in part a function of the impedance of the load. Therefore, the varying impedance can necessitate varying the parameters of the power applied to the load in order to maintain optimum application of power from the RF power supply to the load.

In the RF power generator or supply field, there are typically two approaches to applying the RF signal to the load. A first, more traditional approach is to apply a continuous wave signal to the load. In a continuous wave mode, the continuous wave signal is typically a sinusoidal wave that is output continuously by the power source to the load. In the continuous wave approach, the RF signal assumes a sinusoidal output, and the amplitude and/or frequency of the sinusoidal wave can be varied in order to vary the output power applied to the load.

A second approach to applying the RF signal to the load involves pulsing the RF signal, rather than applying a continuous wave signal to the load. In a pulse mode of operation, a RF sinusoidal signal is modulated by a modulation signal in order to define an envelope for the modulated sinusoidal signal. In a conventional pulse modulation scheme, the RF sinusoidal signal typically is output at a constant frequency and amplitude. Power delivered to the load is varied by varying the modulation signal, rather than varying the sinusoidal, RF signal.

In plasma systems, power is typically delivered in one of two configurations. In a first configuration, the power is capacitively coupled to the plasma chamber. Such systems are referred to as capacitively coupled plasma (CCP) systems. In a second configuration, the power is inductively coupled to the plasma chamber. Such systems are typically referred to as inductively coupled plasma (ICP) systems. Plasma delivery systems typically include a bias and a source that apply respective bias power and source power to one or a plurality of electrodes. The source power typically generates a plasma within the plasma chamber, and the bias power tunes the plasma to an energy relative to the bias RF power supply. The bias and the source may share the same electrode or may use separate electrodes, in accordance with various design considerations.

RF plasma processing systems include components for plasma generation and control. One such component is referred to as a plasma chamber or reactor. A typical plasma chamber or reactor utilized in RF plasma processing systems, such as by way of example, for thin-film manufacturing, utilizes a dual frequency system. One frequency (the source) of the dual frequency system controls the generation of the plasma, and the other frequency (the bias) of the dual frequency system controls ion energy.

By way of one non-limiting example, reactive-ion etching (RIE) is an etching technology used in microfabrication. RIE is typically characterized as dry etching. RIE uses a chemically reactive plasma to remove material deposited on wafers. The plasma is generated under low pressure (vacuum) by an electromagnetic field. High-energy ions from the plasma bombard the wafer surface and react with it to affect the etching process. In one example of a RIE system, a high frequency source RF power generator (for example, 13 MHz-100 MHz) creates a plasma, and a lower frequency bias RF generator (100 kHz-13 MHz) accelerates positive ions from the plasma to the substrate surface to control ion energy and etch anisotropy. In this example dual frequency drive system, the low frequency bias source introduces fluctuations in both the power and load impedance and into source RF generator.

One approach responsive to fluctuations in both the power and load impedance introduced into the source RF generator utilizes multiple source and bias generators to improve control of the plasma. In such a configuration, the plasma consists of a generally neutrally charged bulk region and a sheath region that oscillates near the surfaces of the vacuum chamber and substrate. The thickness of the sheath determines a significant portion of the plasma capacitance and is most affected by the low frequency bias power supply. The higher frequency source generator can be adversely affected by the sheath capacitance variation, resulting in large impedance and reflected power fluctuations. These fluctuations are usually too fast to be measured by present sensors and metrology systems.

As a result of the bias-induced capacitance fluctuations, little or no RF source power is delivered to the plasma when the reflected power is high. Conventional techniques address this limitation by increasing the power level of the source RF generator. Such a response carries with it significant control complexities and additional capital and operating costs. For example, when a RF source operates at an increased power, increased electrical stresses and a greater numbers of parts required to supply the higher power result in lower reliability of the RF generator. Further yet, such an approach impedes process reliability, as process repeatability and chamber matching are adversely affected because of parameters that cannot be reliably controlled, such as chamber RF parasitic impedances and RF amplifier component tolerances.

SUMMARY

This section provides a general summary of the disclosure, and is not a comprehensive disclosure of its full scope or all of its features.

An RF supply system in which a first RF generator and a second RF generator provide respective RF output power signals to a load, such as a plasma chamber. One of the first and second generators operates at a first frequency, and a second of the RF generators operates at a second frequency. One of the first and second generators detects a triggering event. In response to the triggering event, the one of the first and second generators initiates adjusting the frequency of its RF output power signal in order to respond to impedance fluctuations in the plasma chamber that occur with respect to the triggering event.

Further areas of applicability of the present disclosure will become apparent from the detailed description, the claims and the drawings. The detailed description and specific examples are intended for purposes of illustration only and are not intended to limit the scope of the disclosure.

DRAWINGS

The drawings described herein are for illustrative purposes only of selected embodiments and not all possible implementations, and are not intended to limit the scope of the present disclosure.

The present disclosure will become more fully understood from the detailed description and the accompanying drawings. The drawings described herein are for illustrative purposes only of selected embodiments and not all possible implementations, and are not intended to limit the scope of the present disclosure.

In the drawings, reference numbers may be reused to identify similar and/or identical elements.

Corresponding reference numerals indicate corresponding parts throughout the several views of the drawings.

DETAILED DESCRIPTION

Example embodiments will now be described more fully with reference to the accompanying drawings.

Figure 1:
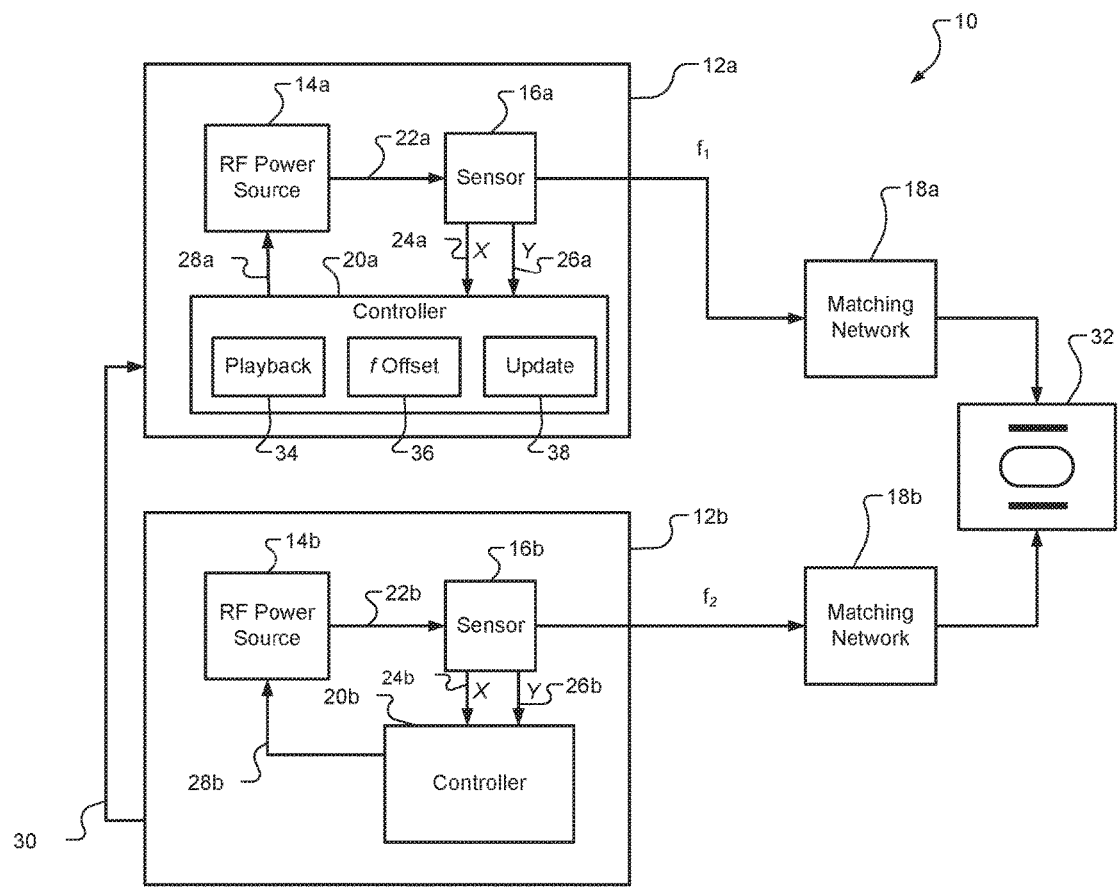
FIG. 1 is a schematic diagram of a plasma bias cancellation system arranged in accordance with the present disclosure.

FIG. 1 depicts a RF generator or power supply system 10. Power supply system 10 includes a pair of radio frequency (RF) generators or power supplies 12a, 12b, matching networks 18a, 18b, and load or plasma chamber 32. In various embodiments, RF generator 12a is referred to as a source RF generator, and matching network 18a is referred to as a source matching network. Also in various embodiments, RF generator 12b is referred to as a bias RF generator, and matching network 18b is referred to as a bias matching network.

Bias RF generator 12b generates a control signal 30 that is input to source RF generator 12a. As will be explained in greater detail, control signal 30 includes information about the operation of bias RF generator 12b that enables predictive responsiveness to address fluctuations in the impedance of plasma chamber 32. When control signal 30 is absent, RF generators 12a, 12b operate autonomously. RF generators 12a, 12b include respective RF power sources or amplifiers 14a, 14b, RF sensors 16a, 16b, and processors, controllers, or control modules 20a, 20b. RF power sources 14a, 14b generate respective RF power signals 22a, 22b output to respective sensors 16a, 16b. Sensors 16a, 16b receive the output of RF power sources 14a, 14b and generate respective RF power signals $f_1$ and $f_2$. Sensors 16a, 16b also output signals that vary in accordance with various parameters sensed from load 32. While sensors 16a, 16b, are shown within respective RF generators 12a, 12b, it should be noted that RF sensors 16a, 16b can be located externally to the RF power generators 12a, 12b. Such external sensing can occur at the output of the RF generator, at the input of the impedance matching device that is located between the RF generator and the plasma chamber, or between the output of the impedance matching circuit (including, inside the impedance matching device) and the plasma chamber.

Sensors 16a, 16b detect operating parameters of plasma chamber 32 and output signals X and Y. Sensors 16a, 16b may include voltage, current, and/or directional coupler sensors. Sensors 16a, 16b may detect (i) voltage V and current I and/or (ii) forward (or source) power $P_{FWD}$ output from respective power amplifiers 14a, 14b and/or RF generators 12a, 12b and reverse (or reflected) power $P_{REV}$ received from respective matching network 18a, 18b or a load 32 connected to respective sensors 16a, 16b. The voltage V, current I, forward power $P_{FWD}$, and reverse power $P_{REV}$ may be scaled and/or filtered versions of the actual voltage, current, forward power, and reverse power associated with the respective power sources 14a, 14b. Sensors 16a, 16b may be analog and/or digital sensors. In a digital implementation, the sensors 16a, 16b may include analog-to-digital (ND) converters and signal sampling components with corresponding sampling rates. Signals X and Y can represent any of the voltage V and current I or forward (or source) power $P_{FWD}$ reverse (or reflected) power $P_{REV}$.

Sensors 16a, 16b generate sensor signals X, Y, which are received by respective controllers or power control modules 20a, 20b. Power control modules 20a, 20b process the respective X, Y signals 24a, 26a and 24b, 26b and generate one or a plurality of feedback control signals to respective power sources 14a, 14b. Power sources 14a, 14b adjust the RF power signals 22a, 22b based on the received feedback control signal. Power control modules 20a, 20b may include at least, proportional integral derivative (PID) controllers or subsets thereof and/or direct digital synthesis (DDS) component(s) and/or any of the various components described below in connection with the term modules. In various embodiments, power control modules 20a, 20b are first PID controllers or subsets and may include functions, processes, processors, or submodules. Feedback control signals 28a, 28b may be drive signals and have a DC offset or rail voltage, voltage or current magnitude, a frequency, and a phase.

In various embodiments, RF power source 14a, sensor 16a, controller 20a, and match network 18a can be referred to as source RF power source 14a, source sensor 16a, source controller 20a, and source matching network 18a. Similarly in various embodiments, RF power source 14b, sensor 16b, controller 20b, and match network 18b can be referred to as bias RF power source 14b, bias sensor 16b, bias controller 20b, and bias matching network 18b. In various embodiments and as described above, the source term refers to the RF generator that generates the plasma, and the bias term refers to the RF generator that tunes the plasma Ion Energy Distribution Function (IEDF) relative to the bias RF power supply. In various embodiments, the source and bias RF power supplies operate at different frequencies. In various embodiments, the source RF power supply operates at a higher frequency than the bias RF power supply.

In various embodiments, source controller 20a adjusts the frequency of RF signal $f_1$ to compensate for impedance fluctuations resulting from the application of RF signal $f_2$ to plasma chamber 32. In various embodiments, RF signal $f_2$ is a frequency lower than the frequency of RF signal $f_1$. The lower frequency introduces intermodulation distortion (IMD), and the IMD causes impedance fluctuations in plasma chamber 32. Using the periodic nature of both RF signals $f_1$ and $f_2$, frequency offsets can be added to RF signal $f_1$ to compensate for the anticipated impedance fluctuations introduced by RF signal $f_2$. The frequency offsets can be predetermined and stored in a lookup table, or the frequency offsets can be determined dynamically.

Source controller 20a includes a playback module 34, a frequency offset module 36, and an update module 38. Each module 34, 36, 38 can be implemented collectively or individually as a process, a processor, a module, or a submodule. Further, each module 34, 36, 38 can be implemented as any of the various components described below in connection with the term module. Playback module 34 monitors for a triggering event or signal with which to synchronize the application of frequency offsets to RF signal $f_1$. Once playback module 34 detects a triggering event or signal, playback module 34 initiates the addition of frequency offsets to RF signal $f_1$. Playback module 34 cooperates with frequency offset module 36, and frequency offset module 36 provides frequency offsets to playback module 34 which coordinates the application of the frequency offset to RF signal $f_1$.

In various embodiments, frequency offset module 36 is implemented as a lookup table (LUT). Frequency offsets are determined in accordance with, for example, a time or phase delay relative to the triggering event or signal. Given the periodic nature of RF signal $f_2$ and the expected periodic impedance fluctuations that occur in response to application of RF signal $f_2$ to load 32, a LUT of the offsets for RF signal $f_1$ can be determined. The frequency offsets added to RF signal $f_1$ are generated to align with interference introduced by RF generator 12b and at least partially cancels the bias RF interference, thereby reducing impedance fluctuations. In various embodiments, the LUT can be statically determined by experimentation, or automatically adjusted with an update process, such as update module 38.

Figure 2:
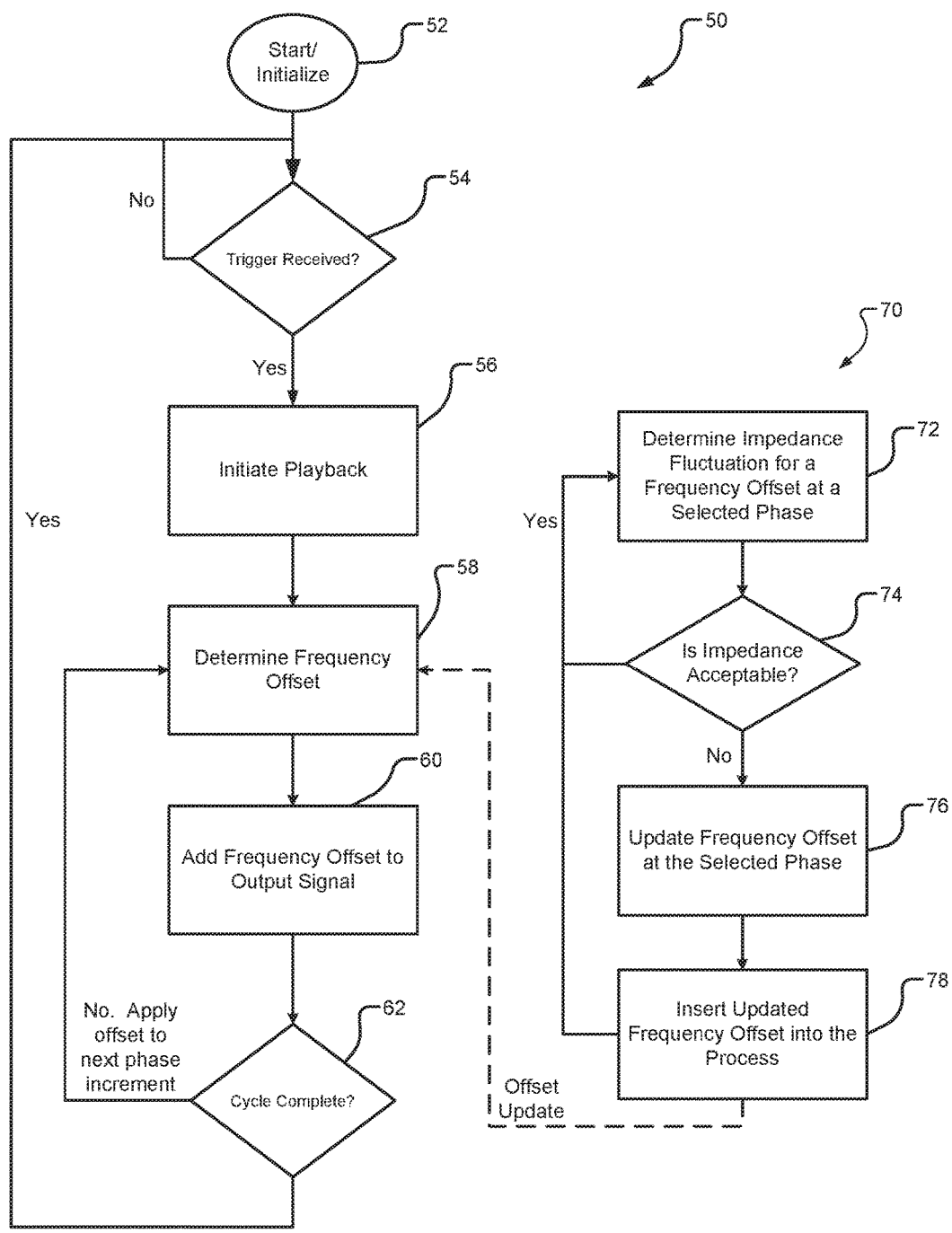
FIG. 2 is a flow diagram of the operation of the system arranged in accordance with the present disclosure.

FIG. 2 depicts a flow diagram of the bias cancellation method 50 described in the present disclosure. Control begins at block 52 in which various parameters are initialized. Control proceeds to block 54 which monitors for a trigger event. As will be described in greater detail herein, a trigger event can be any event which allows suitable alignment of frequency offsets with RF signal $f_1$ output by RF generator 12a. Block 54 continues to monitor whether a trigger event has occurred and loops back in a wait state until such an event has occurred. Upon detection of a trigger event, control proceeds to block 56 which initiates playback of a frequency offset sequence synchronized to the occurrence of the triggering event.

Once playback is initiated, control proceeds to block 58. At block 58, frequency adjustments are determined relative to the trigger event. The frequency offsets are in various embodiments determined in accordance with an expected impedance fluctuation reference to an event, such as sequencing of an RF signal output from bias RF generator 12b. Once the frequency offset is determined, typically in relation to the trigger event, control proceeds to block 60 in which the frequency offset is added to the RF signal output from RF generator 12a. Control proceeds to block 62 which determines if the playback sequence has completed. That is, at decision block 62, if the playback sequence is completed, control proceeds to decision block 54 where monitoring for a trigger event continues. If the playback sequence is not completed, control proceeds to block 58 where the frequency offset is determined.

Also shown in FIG. 2 is a flow diagram 70 for updating the frequency offsets of block 58. Flow diagram 70 may be implemented by update module 38 of controller 20a. In flow diagram 70, control commences at block 72 which determines an impedance fluctuation at a selected phase relative to, for example, the trigger event. Control proceeds to decision block 74 which determines whether the impedance is acceptable. That is, at decision block 74, the impedance in the load 32 is compared to a threshold to determine if the impedance is acceptable or within a threshold for a given frequency offset. If the impedance is acceptable, control proceeds back to block 72. If the impedance is outside a predetermined range or threshold, control proceeds to block 76 which updates the frequency offset at the selected phase in order to reduce impedance fluctuation. Once the frequency offset at the selected phase is determined, control proceeds to block 78 which proceeds to insert the updated frequency offset into block 58 which determines the frequency offset.

In various embodiments the trigger event, such as discussed with respect to block 54, is intended to synchronize bias RF generator 12b with source RF generator 12a so that frequency offsets can be appropriately applied relative to the bias RF signal, thereby minimizing impedance fluctuation. Synchronization between RF generators 12a, 12b can occur using control signal 30 which may provide a synchronization pulse or may replicate the RF signal output from RF generator 12b. In various other embodiments, synchronization with RF generator 12b can occur without a direct connection such as control signal 30 or other direct connection between RF generators 12a, 12b.

Synchronization without a direct connection can be achieved by analyzing the impedance fluctuation and phase-locking to a signal indicating the impedance fluctuation. For example, by analyzing signals X, Y output from sensor 16a, a signal indicating the impedance fluctuations can be generated. This signal can provide the appropriate trigger event. A signal indicating impedance fluctuation can be developed by performing a Fast Fourier transform (FFT) on the impedance fluctuation. In this configuration, the source RF generator 12a can effectively work as a standalone unit without connection to bias RF generator 12b.

The trigger events described in the various embodiments above are typically related to a periodicity of the trigger event. For example, the control signal received from bias RF generator 12b output control signal 30 may repeat periodically in accordance with the RF signal output from RF generator 12b. Similarly, the above-discussed signal indicating an impedance fluctuation may also have a periodicity to it. Other triggering events need not be periodic. In various embodiments, a triggering event can be a non-periodic, asynchronous event, such as an arc detected within plasma chamber 32. In various other embodiments, a triggering event can be associated with control loop times of source RF generator 12a, referred to as the power control loop. When the trigger event is associated with the power control loop of source RF generator 12a, a signal that is typically much slower than the digital control loop for RF generator 12a pulses provides a triggering event.

In various embodiments, frequency offset module 36 and corresponding block 58, in which the frequency offset is determined, can be implemented in a lookup table (LUT). The LUT can be statically determined by obtaining empirical data relating impedance fluctuations relative to the bias RF signal output from RF generator 12b and applied to plasma chamber 32. When the LUT is determined statically, flow diagram 70 of FIG. 2 may not be applicable. In other in various embodiments, LUT can be determined dynamically as described with respect to flow diagram 70. One example of dynamically updating the offset frequencies includes automatic frequency tuning to determine a specific portion or bin of the frequency offset. The reflected power for that bin may be examined, such as using sensor 16a, and corrected. This correction provides the frequency offset for the selected bin.

In various embodiments, the frequency offsets can be applied in equal increments relative to the RF signal output by bias RF generator 12b, providing a consistent resolution over the range of frequency offsets. In various other embodiments, the resolution of the frequency offsets can vary. That is, the frequency offsets can be variably spaced in time so that more offsets may be applied for a given duration of the bias RF output signal, and fewer offsets may be applied for the same duration in a different portion of the bias RF output signal. The state-based approach herein thus increases resolution of the frequency offsets where necessary, such as when the impedance fluctuation is more unstable for a given period, and decreases resolution of the frequency offsets where appropriate, such as where the impedance fluctuation is more stable for a given period. A state-based approach can provide a more efficient implementation by reducing computational or processing overhead where appropriate. In various embodiments, the magnitude of each offset can vary.

In various embodiments, frequency offsets are provided using frequency modulation in the digital domain. In a digital domain, a Direct Digital Synthesizer (DDS) can implement the frequency offsets, such as discussed with respect to block 60 of FIG. 2. In various other embodiments, frequency offsets can be introduced using various circuitry. Such circuitry can include a voltage-controlled oscillator (VCO) to add frequency offsets to the RF signal output from RF generator 12a.

In various other embodiments, feedback control loop within RF generator 12a can provide information for applying the offset frequencies and can apply frequencies dynamically, without reference to predetermined offsets. In order to implement such a system, existing frequency tuning methods, such as servo-based frequency tuning or dynamic frequency impedance information, are utilized. This impedance information can be used to prospectively adjust the frequency offset in order to correspondingly reduce the impedance fluctuations.

Figure 3:
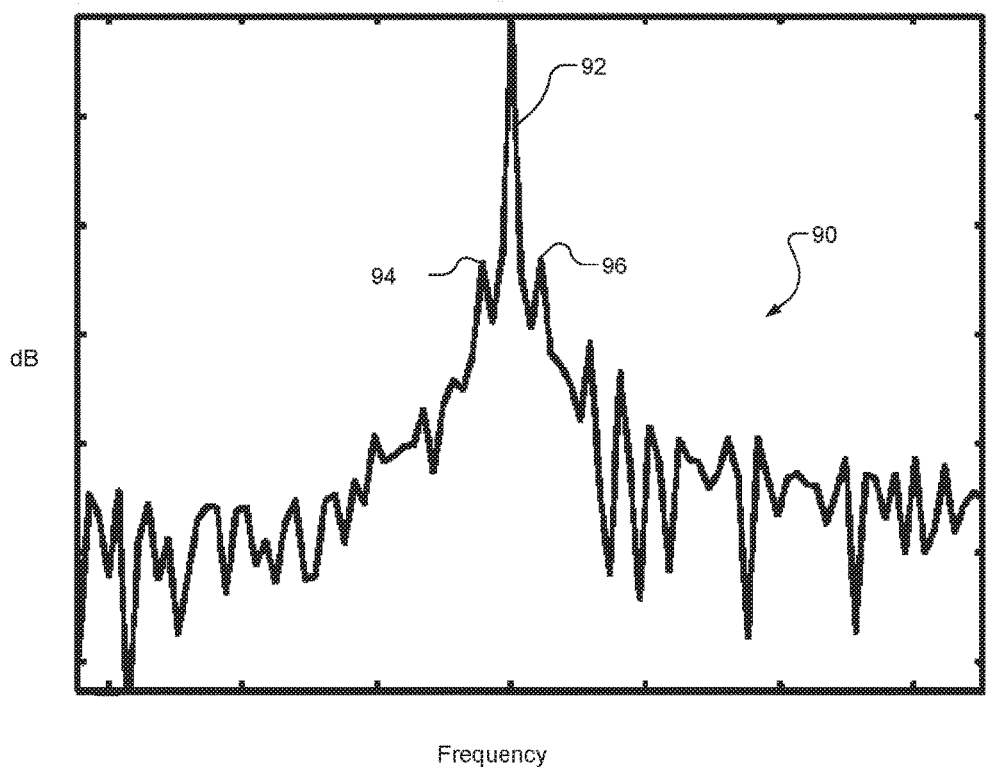
FIG. 3 is a plot of waveform of impedance versus frequency for a RF control system in which two frequency signals supply power.
Figure 4:
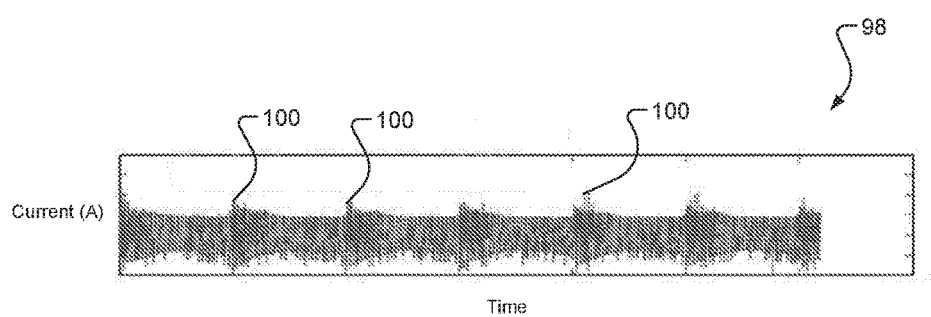
FIG. 4 is a plot of time versus current for the waveform of FIG. 3.

FIGS. 3 and 4 depict waveforms exemplary of a capacitive discharge from a plasma chamber operated at a relatively low bias frequency $f_b$ and a relatively high source frequency $f_s$ for a RF power delivery system not applying the frequency offset techniques described herein. Waveform 90 of FIG. 3 shows the IMD, with waveform 90 having a peak 92 at $f_s$ and peaks 94, 96 indicating the IMD at $f_s-f_b$ and $f_s+f_b$ respectively. The IMD shown at peaks 94, 96 indicates areas of impedance fluctuation, which is undesirable. FIG. 4 depicts the modulating plasma current (in amperes) versus time. As can be seen in FIG. 4, the peaks 100 indicate fluctuation in the plasma current resulting from corresponding impedance fluctuations. The peaks 100 are $1/f_b$ apart, which corresponds to a frequency of $f_b$, the frequency of the bias RF signal. Thus, FIGS. 3 and 4 indicate that IMD introduced by the bias RF output signal, as evidenced by the resulting current fluctuations, introduces unwanted peaks in the plasma current. The impedance fluctuations hinder the desirable control of the RF system.

Figure 5:
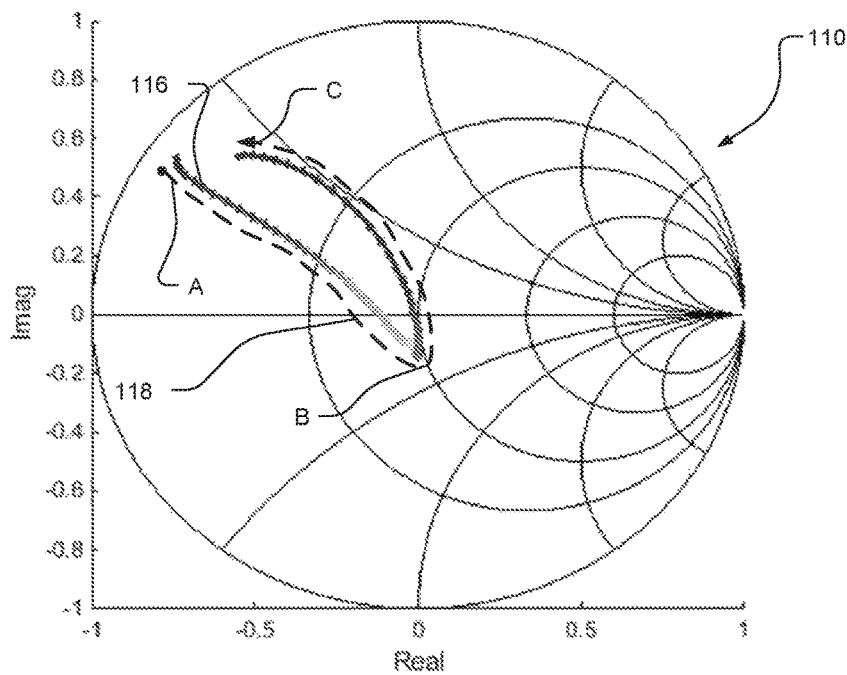
FIG. 5 is a plot of impedance fluctuations in a load varying in accordance with one of two RF signals of different frequencies applied to the load.
Figure 6A:
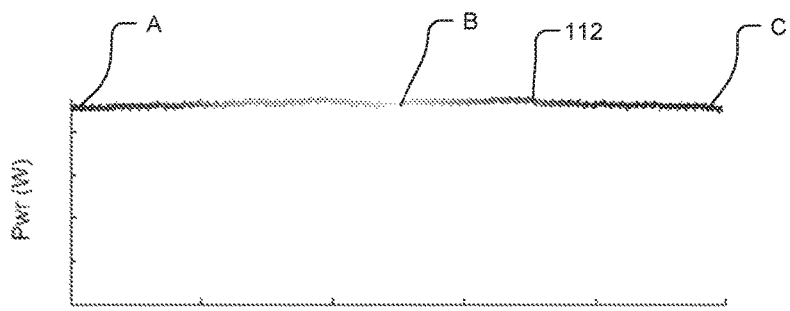
FIGS. 6a and 6b depict forward power and reverse power with respect to time in response to impedance fluctuations of FIG. 5.
Figure 6B:
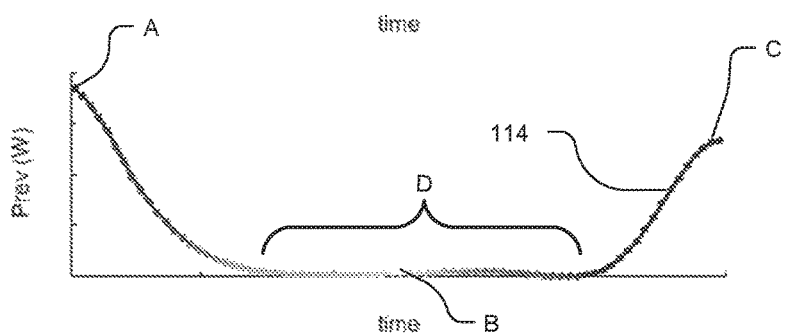

FIGS. 5, 6a, and 6b demonstrate the effect of the impedance fluctuations introduced by RF power delivery systems not applying the frequency offset techniques described herein and the delivery of power to the load or a plasma chamber. In the example of FIGS. 5, 6a, and 6b, a source RF power supply is operated at a relatively high frequency $f_s$, and the bias power supply is operated at a relatively low frequency $f_b$. The bias RF power supply, thus, has a cycle time of $1/f_b$.

FIG. 5 depicts the Smith chart 110 indicating the impedance fluctuations as the bias RF power supply applies the $f_b$ RF signal to a plasma chamber. Plot 116 in Smith chart 110 indicates the impedance fluctuates from a desirable position near the center of Smith chart 110 to an undesirable position near the outer boundaries of Smith chart 110. Near the outer boundaries of Smith chart 110, impedance is higher, increasing the reflected power, thereby reducing the power the source RF generator can deliver to the plasma chamber.

FIGS. 6a and 6b indicate the variation in the respective forward power $P_{FWD}$ and reverse power $P_{REV}$ of the source RF signal applied to the plasma chamber as the impedance in the plasma chamber varies over a single period of the $f_b$ bias signal. The timescale for the forward power and reverse power in FIGS. 6a and 6b covers a 1/$f_b$ period. Waveform 112 of FIG. 6a represents the forward power of the source RF signal and remains generally constant at or near an approximate maximum. Waveform 114 of FIG. 6b represents the reverse power of the source RF signal and fluctuates from at or near an approximate high, ramping down to approximately zero and remaining near zero until for a time D. Following the time D, the reverse power ramps upward to at or near an approximate high.

With reference again to FIG. 5, dotted line 118 provides a reference of plot 116 of Smith chart 110 with the timescale of FIGS. 6a and 6b. At position A on line 118, the reverse power shown in FIGS. 6a and 6b is at or near an approximate maximum. Similarly, at position C on line 118, the reverse power shown in FIGS. 6a and 6b is also at or near an approximate maximum. The instances of generally high reverse power indicate a poor impedance match at the plasma chamber and coincide with points on plot 116 being located toward the outer boundaries of Smith chart 110. Conversely, in the region near position B at time D, the reverse power shown in FIGS. 6a and 6b is near zero. The region of reverse power being approximately zero coincides to the portion of plot 116 being near or below the imaginary axis of Smith chart 110. The impedance fluctuation described in connection with FIGS. 5, 6a, and 6b repeats for each cycle of the bias RF power signal, yielding generally high impedance fluctuations and corresponding high reverse power at the source RF power supply. The impedance fluctuations significantly impact the application of the source RF power signal for approximately 40% of the bias RF signal.

Figure 7:
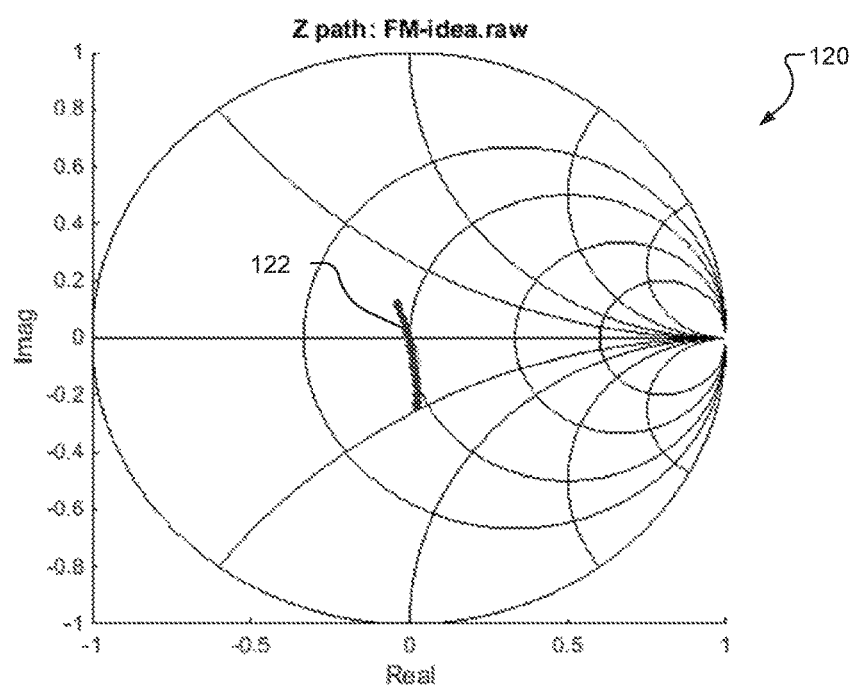
FIG. 7 is a plot of impedance fluctuations in a RF bias cancellation system arranged according to the present disclosure.
Figure 8:
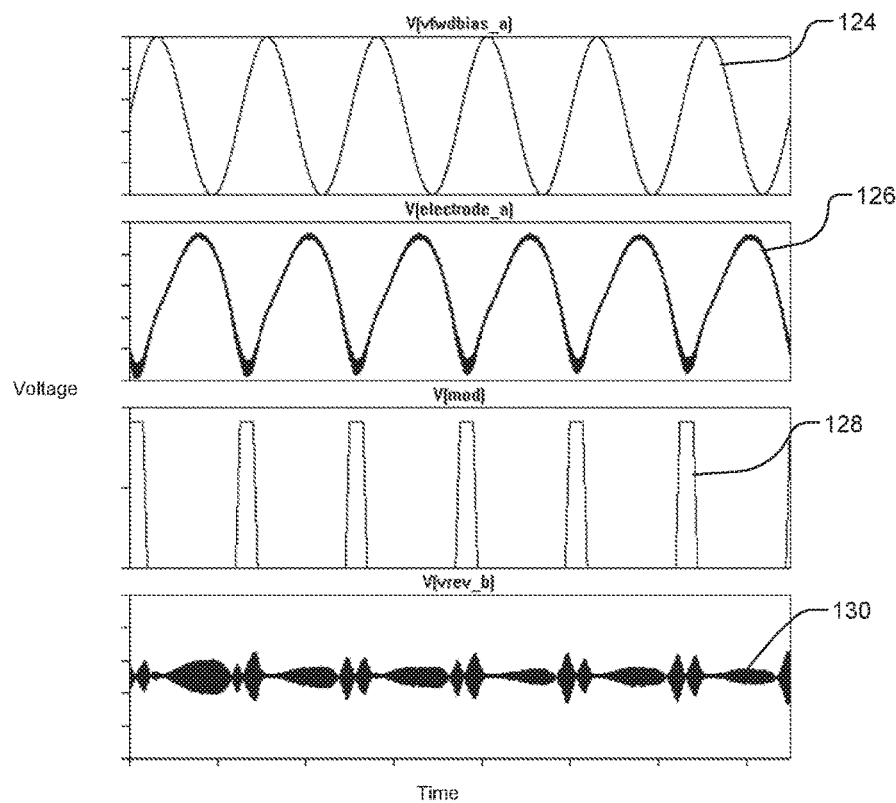
FIG. 8 depicts exemplary waveforms demonstrating the improvement provided by the system arranged according to the present disclosure.

FIGS. 7 and 8 demonstrate the improvement to the impedance fluctuations provided the system of the present disclosure to the impedance fluctuations over conventional RF power delivery systems. FIG. 7 depicts Smith chart 120 showing a plot 122. As can be seen from plot 122, impedance fluctuation is significantly reduced over the impedance plot 116 of Smith chart 110 in FIG. 5.

Figure 9:
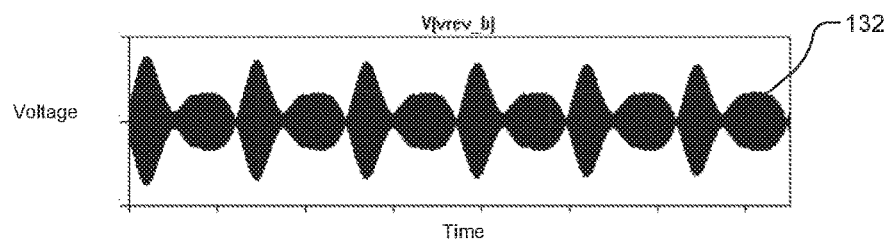
FIG. 9 depicts the reverse power of a system not having an arrangement according to the present disclosure.

FIG. 8 depicts another example of a benefit provided by the present disclosure. FIG. 8 depicts waveforms of a bias RF power signal 124, a composite of the source RF power signal and the bias RF power signal 126, and a frequency offset signal 128. In the non-limiting example of FIG. 8, it should be noted that the frequency offset signal 128 applies only a single offset frequency over a portion of the bias waveform, and the single offset frequency is synchronized to a minimum of the composite of the source RF power signal and the bias RF power signal 126. Waveform 130 indicates reflected power when the system of the present disclosure is used to apply and offset frequency to the source RF signal. Waveform 132 of FIG. 9 indicates the reflected power for a system implemented without adding offset frequencies to the source RF power signal as described according to the present disclosure. As can be seen, waveform 130 indicates a significant decrease in reflected power over waveform 132.

Figure 10:
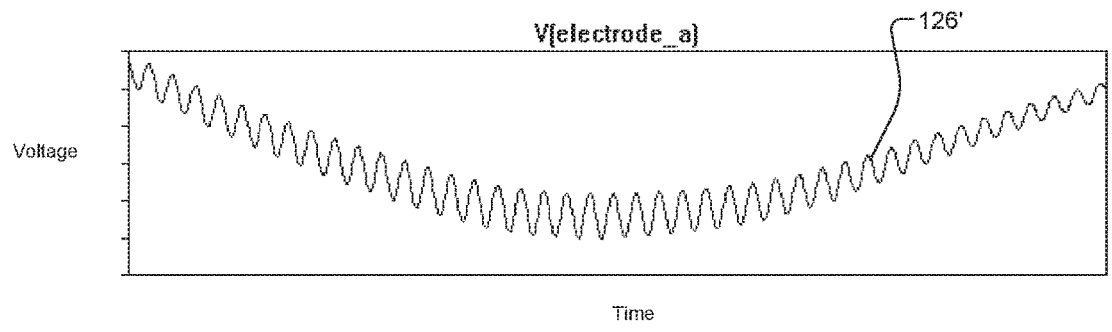
FIG. 10 is an expanded view of one of the waveforms of FIG. 8.

FIG. 10 depicts a waveform 126'. Waveform 126' depicts a portion of waveform 126 of FIG. 8. Waveform 126' of FIG. 10 is intended to show the composite nature of waveform 126 of FIG. 8. As described above, waveform 126 is a composite of the source RF power signal and the bias RF power signal. Thus, waveform 126 has a relatively low frequency component, provided by one of the source or the bias RF power supplies, and a relatively high frequency component, provided by the other of the source or the RF bias RF power supplies. Waveforms 126, 126' represent the RF signal sampled at an electrode of the plasma chamber, such as may be connected to source RF power supply. Composite waveform 126 thus includes a lower frequency component and a higher frequency component. In waveform 126', the gradual arc corresponds to the lower frequency signal, and the repeating sinusoidal peaks correspond to the higher frequency signal.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, MATLAB®, Simulink®, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A radio frequency (RF) generator comprising:
a RF power source; and
a RF power controller coupled to the RF power source, the RF power controller generating a control signal to vary a RF output from the RF power source, the RF power controller configured to operate in response to a trigger signal and introduce a frequency offset to the RF output,
wherein the frequency offset varies in accordance with an external RF output from an external RF generator.

2. The RF generator of claim 1, wherein the RF output is a source RF signal applied to a plasma chamber and the external RF output is a bias RF signal applied to the plasma chamber.

3. The RF generator of claim 1, wherein the RF power controller introduces the frequency offset to the RF output in accordance with a timing that varies in accordance with the trigger signal, wherein the trigger signal indicates a relative position of the external RF output.

4. The RF generator of claim 1, wherein the RF power controller obtains the frequency offset from memory or calculates the frequency offset.

5. The RF generator of claim 1, wherein the frequency offset includes a plurality of frequencies that the RF power controller introduces to the RF output in a predetermined order and timing in accordance with the trigger signal.

6. The RF generator of claim 1, wherein the RF power controller updates the frequency offset in accordance with the external RF output.

7. The RF generator of claim 1, wherein the frequency offset varies in accordance with an intermodulation distortion caused by the external RF output.

8. The RF generator of claim 1, wherein the frequency of the RF output is great than the external RF output.

9. The RF generator of claim 1, wherein the RF power controller further comprises a playback module, the playback module configured to detect the trigger signal, the playback module initiating introduction of a frequency offset to RF output.

10. The RF generator of claim 9, wherein the RF power controller further comprises a lookup table, the lookup table configured to store the frequency offset introduced by the playback module.

11. The RF generator of claim 10, wherein the RF power controller further comprises an update module, the update module configured to update the frequency offset in accordance with an electrical characteristic of the RF output.

12. The RF generator of claim 11 wherein the electrical characteristic is an impedance of a load connected to the RF generator.

13. The RF generator of claim 1 wherein the trigger signal is one of periodic, non-periodic, synchronous to a predetermined event, or asynchronous.

14. A radio frequency (RF) system comprising:
a first RF generator including a first power source generating a first RF signal applied to a load; and
a second RF generator including:
a second power source generating a second RF signal applied to the load; and
a power controller coupled to the second power source, the power controller configured to respond to a trigger signal and to generate a control signal to vary the second RF signal, wherein the control signal selectively introduces a frequency offset into the second RF signal.

15. The RF system of claim 14, wherein the second RF signal is a source signal applied to the load and the first RF signal is a bias signal applied to the load, and wherein the load is a plasma chamber.

16. The RF system of claim 14, wherein the trigger signal varies in accordance with the first RF signal and wherein the power controller is configured to vary the control signal to introduce the frequency offset into the second RF signal in a position relative to the second RF signal.

17. The RF system of claim 14, wherein the power controller obtains the frequency offset from memory or calculates the frequency offset.

18. The RF system of claim 17, wherein the frequency offset includes a sequence of frequencies that the power controller introduces to the second RF signal in accordance with the trigger signal.

19. The RF system of claim 18, wherein the power controller introduces the sequence of frequencies to the second RF signal with a fixed or variable interval between each member of the sequence of frequencies.

20. The RF system of claim 14, wherein the power controller updates the frequency offset in accordance with a property of the second RF signal.

21. The RF system of claim 14, where in the RF controller generates the trigger signal in accordance with an impedance of the load.

22. The RF system of claim 14, wherein the RF controller further generates a trigger signal in accordance with phase-locking to impedance fluctuations in the load.

23. The RF system of claim 22, wherein the second RF generator further comprises a sensor for measuring an impedance and the load, the sensor generating a signal from which impedance fluctuations in the load are determined.

24. The RF system of claim 22, wherein the frequency offset reduces the impedance fluctuations in the load.

25. The RF generator of claim 14 wherein the trigger signal is one of periodic, non-periodic, synchronous to a predetermined event, or asynchronous.

26. The RF generator of claim 14 wherein the trigger signal is associated with a power control loop of the second RF generator.

27. A method for generating a radio frequency (RF) signal comprising:
coupling a power controller to a RF power source;
controlling a first RF generator to output a first RF output signal;
generating a control signal, the control signal varying an electrical characteristic of the first RF output signal;
varying the control signal to introduce a frequency offset into the first RF output signal,
wherein the frequency offset varies in accordance with a second RF output signal from an external RF generator.

28. The method of claim 27 further comprising introducing the frequency offset into the first RF output signal in accordance with a trigger signal, wherein the trigger signal varies in accordance with one of the second RF output signal or an impedance fluctuation in a load receiving the first RF output signal.

29. The method of claim 28, wherein when the trigger signal varies in accordance with the second RF output signal, determining where in the first RF output signal the power controller introduces the frequency offset into the first RF output signal.

30. The method of claim 27, further comprising coupling the first RF output signal to a source electrode of a plasma chamber and coupling the second RF output signal applied to bias electrode of a plasma chamber.

31. The method of claim 27 further comprising updating the frequency offset in accordance with one of the output of the second RF output signal or an impedance fluctuation in a load coupled to the first RF generator.

32. The method of claim 31 further comprising updating the frequency offset in accordance with phase-locking to impedance fluctuations in the load.

33. The method of claim 31, wherein the frequency offset reduces the impedance fluctuations in the load.

* * * * *